United States Patent
Chiappe

(10) Patent No.: US 9,472,401 B2
(45) Date of Patent: Oct. 18, 2016

(54) MOLYBDENUM DISULFIDE FILM FORMATION AND TRANSFER TO A SUBSTRATE

(71) Applicant: IMEC VZW, Leuven (BE)

(72) Inventor: Daniele Chiappe, Leuven (BE)

(73) Assignees: IMEC VZW, Leuven (BE); Katholieke Universiteit Leuven, KU Leuven R & D, Leuven (BE)

( * ) Notice: Subject to any disclaimer, the term of this patent is extended or adjusted under 35 U.S.C. 154(b) by 0 days.

(21) Appl. No.: 14/938,657

(22) Filed: Nov. 11, 2015

(65) Prior Publication Data

US 2016/0141174 A1 May 19, 2016

(30) Foreign Application Priority Data

Nov. 18, 2014 (EP) .................................. 14193712
Jan. 6, 2015 (EP) .................................. 15150151

(51) Int. Cl.
| | | |
|---|---|---|
| *H01L 21/02* | (2006.01) | |
| *H01L 21/324* | (2006.01) | |
| *H01L 29/24* | (2006.01) | |
| *C01G 39/02* | (2006.01) | |
| *C01G 39/06* | (2006.01) | |

(52) U.S. Cl.
CPC ......... *H01L 21/02568* (2013.01); *C01G 39/02* (2013.01); *C01G 39/06* (2013.01); *H01L 21/02381* (2013.01); *H01L 21/02614* (2013.01); *H01L 21/02628* (2013.01); *H01L 21/02664* (2013.01); *H01L 21/324* (2013.01); *H01L 29/24* (2013.01); *C01P 2002/82* (2013.01); *C01P 2002/85* (2013.01); *C01P 2004/04* (2013.01)

(58) Field of Classification Search
CPC . C01G 39/02; C01G 39/06; H01L 21/02381; H01L 21/02568; H01L 21/02614; H01L 21/02628; H01L 21/02664; H01L 21/324; H01L 29/24
See application file for complete search history.

(56) References Cited

U.S. PATENT DOCUMENTS

| | | | |
|---|---|---|---|
| 6,451,729 B1 * | 9/2002 | Song ...................... | B01J 27/051 423/511 |
| 2007/0158197 A1 * | 7/2007 | Wang ...................... | C25D 9/08 205/50 |
| 2010/0304964 A1 * | 12/2010 | Anand .................... | B01J 27/04 502/220 |
| 2013/0068613 A1 * | 3/2013 | Hu ......................... | B01J 27/047 204/290.13 |
| 2014/0353166 A1 * | 12/2014 | Iezzi .................... | B01J 37/0238 205/638 |
| 2015/0023858 A1 * | 1/2015 | Tour ...................... | C01B 21/064 423/276 |
| 2015/0179878 A1 * | 6/2015 | Park .................. | H01L 21/02458 257/13 |
| 2015/0332920 A1 * | 11/2015 | Shin .................. | H01L 21/02568 257/26 |

OTHER PUBLICATIONS

Laskar et al. "Large area single crystal (0001) oriented MoS2", Applied Physics Letters 102, 252108 (2013).

(Continued)

*Primary Examiner* — Allan R Wilson
(74) *Attorney, Agent, or Firm* — Knobbe Martens Olson & Bear, LLP

(57) ABSTRACT

A method is provided for forming an unsupported $MoS_2$ layer in an aqueous medium, the method comprising the steps of: providing an assembly of a Mo oxide layer on a Si substrate; annealing said assembly in presence of $H_2S$ at a temperature sufficient for forming a $MoS_2$ layer; and contacting the annealed assembly with an aqueous medium. This unsupported $MoS_2$ layer can then be transferred by dip-coating to another substrate such as a dielectric substrate.

13 Claims, 3 Drawing Sheets

(56) References Cited

OTHER PUBLICATIONS

Liu et al., "Growth of Large-Area and Highly Crystalline MoS2 Thin Layers on Insulating Substrates", Nano Lett., 1538-1544, Published Feb. 2012.

Radisavljevic et al., "Single-layer MoS2 transistors", Nature Nanotechnology, vol. 6, Mar. 2011, 147-150.

Van Der Zande et al., "Grains and grain boundaries in highly crystalline monolayer molybdenum disulphide", Nature Materials, vol. 12, Jun. 2013, 554-561.

* cited by examiner

MOLYBDENUM DISULFIDE FILM FORMATION AND TRANSFER TO A SUBSTRATE

INCORPORATION BY REFERENCE TO RELATED APPLICATIONS

Any and all priority claims identified in the Application Data Sheet, or any correction thereto, are hereby incorporated by reference under 37 CFR 1.57. This application claims the benefit of European Application No. EP14193712.8 filed Nov. 18, 2014 and European Application No. EP15150151.7 filed Jan. 6, 2015. Each of the aforementioned applications is incorporated by reference herein in its entirety, and each is hereby expressly made a part of this specification.

TECHNICAL FIELD OF THE INVENTION $MoS_2$ films suitable for use in microelectronic devices are provided.

BACKGROUND OF THE INVENTION

Two-dimensional (2D) layered transition metal chalcogenides (LTMC) have been emerging as new materials for electronic applications. For instance, two-dimensional $MoS_2$ layers are currently developed for use in fields including field effect transistors, low power switches, optoelectronics, and spintronics.

$MoS_2$ presents itself as a stack of molecular layers held together by weak van der Waals interactions. LTMC materials in general and $MoS_2$ in particular can be separated by exfoliation/delamination techniques into individual two-dimensional sheets. Due to their intrinsic two-dimensional character, these materials show remarkable optical and electronic properties and, importantly, offer a concrete prospect for scaling semiconductor devices to the atomic scale.

In 2011, B. Radisavljevic et al (Nat. Nanotech. 6, 147 (2011)) have integrated for the first time a micrometric $MoS_2$ flake, obtained by mechanical exfoliation from a natural bulk crystal, as a channel layer in a double gated field effect transistor therein showing outstanding performances which make $MoS_2$ competitive with ultra-thin silicon channels.

Large area $MoS_2$ layers have recently been grown by various teams (Arend M. van der Zande et al. Nature Materials 12,554-561(2013); Keng-Ku Liu et al. Nano Lett., 12 (3), 1538 (2012); Masihhur R. Laskar et al. Appl. Phys. Lett. 102, 252108 (2013)), which paves the way to the forthcoming development of manufacturing technology.

Some challenges remain however to be met. One of these is the difficulty to obtain large high quality $MoS_2$ films. High quality $MoS_2$ (in term of surface roughness) has been grown on Si substrates but many applications require the $MoS_2$ film to be present on a dielectric substrate. For instance, a semiconductor substrate such as Si is not suitable for electrical measurements because it induces current leakage.

The synthesis of high quality $MoS_2$ directly on top of dielectric materials is a challenging research topic. The main issue is related to the extremely high temperatures (>700° C.) involved in synthesis processes. These temperatures are not compatible with wafer processing in a standard pilot line environment.

A promising route is the transfer of $MoS_2$ layers from a template substrate to a dielectric substrate. This process is however prone to contamination and degradation issues.

SUMMARY OF THE INVENTION

There is therefore still a need in the art for good methods to transfer $MoS_2$ layers from template substrates to dielectric substrates.

It is an object of certain embodiments to provide good methods for forming a $MoS_2$ layer that can be transferred from a semiconductor substrate to another substrate such as to a dielectric substrate.

It is an advantage of certain embodiments that they enable large scale production of at least defect-poor and typically defect-free $MoS_2$ layers and their transfer to a variety of substrates.

It is an advantage of certain embodiments that they do not rely on ultrasonication and/or lithium intercalation which are methods having limited scalability.

It is an advantage of certain embodiments that they do not rely on chemical etching which may contaminate and damage the $MoS_2$ film.

It is an advantage of certain embodiments that they do not rely on the coating of a $MoS_2$ film with a polymer (which may contaminate the $MoS_2$ film) to enable its transfer to a further substrate.

The above objectives can be accomplished by a method according to the embodiments described herein.

In a first aspect, a method is provided for forming an unsupported $MoS_2$ film in an aqueous medium, the method comprising the steps of, a) providing an assembly of a Mo oxide layer on a Si substrate, b) annealing said assembly in presence of $H_2S$ at a temperature sufficient for forming a $MoS_2$ film, and c) contacting the annealed assembly with an aqueous medium.

The $MoS_2$ film is typically formed in a top portion (i.e. facing away from the Si substrate) of the Mo oxide layer.

This method is particularly advantageous because it enables the formation of a large $MoS_2$ film. That film may actually be composed of one or more layers. For instance, it can be a multilayer film as shown in FIG. 1A. The one or more layers are typically parallel to the Si substrate.

This method also has the advantage of avoiding contaminations and degradation of the $MoS_2$ film.

This method also has the advantage to permit the control of the $MoS_2$ thickness by controlling the thickness of the pristine Mo oxide layer (step a).

In embodiments, the Mo oxide layer may be provided via reactive sputtering of Mo in $O_2$.

In embodiments, step c) may be performed by immersion of the annealed assembly in the aqueous medium.

In embodiments, step b) may be performed in a rapid thermal annealing system.

The unsupported $MoS_2$ film obtained by a method of the first aspect shows the advantage of being easily transferable by dip coating on a second substrate.

In embodiments, the area of the unsupported $MoS_2$ film may be at least 1 $cm^2$, preferably at least 2 $cm^2$, yet more preferably at least 4 $cm^2$. The area of the unsupported $MoS_2$ film can be for instance up to 10 $cm^2$ or even more.

In embodiments, the Mo oxide layer may have a thickness of from 0.5 to 20 nm, preferably from 2 to 14 nm. The thickness of the film is typically uniform.

In embodiments, the Mo oxide layer may be a film comprising $MoO_3$ and/or $Mo_2O_5$. Typically, the Mo oxide layer is a mixture of $MoO_3$ and $Mo_2O_5$.

In embodiments, the annealing step b) may be performed in presence of pure $H_2S$.

In embodiments, the annealing step may be performed at a pressure of from 50 to 200 mbar.

In embodiments, the annealing step b) may comprise heating the substrate to at least 400° C., preferably at least 450° C., more preferably at least 520° C., yet more preferably at least 560° C. and most preferably at least 580° C. Preferably, the annealing step b may comprise heating the substrate to at most 880° C.

In embodiments, the annealing step b) may last from 5 minutes to 1 hour.

In embodiments, the annealing step b) may comprise a first annealing step b1) at a temperature of from 520 to 680° C. for from 5 to 50 minutes and a second annealing step b2) at a temperature of from 720 to 880° C. for from 1 to 10 minutes. The first annealing step b1) typically results in the formation of a uniform $MoS_2$ film, while the second step b2) typically improves the crystalline quality of the film.

In embodiments, the annealing step b may comprise a first annealing step b1) at a temperature of from 560 to 640° C. for from 10 to 40 minutes, preferably at a temperature of from 580 to 620° C. for from 15 to 35 minutes.

Typically, the method of the first aspect is such that the $MoS_2$ film obtained has its Raman spectrum showing two distinctive peaks typical of the in-plane (E2g) mode and the out of plane (A1g) mode of $MoS_2$ (at 383 $cm^{-1}$ and at 408 $cm^{-1}$).

In embodiments, the annealing step b) may comprise a second annealing step b2 at a temperature of from 760 to 840° C. for from 2 to 8 minutes, preferably at a temperature of from 780 to 820° C. for from 4 to 6 minutes.

In embodiments, the $MoS_2$ film formed in step b) may be uniform.

In embodiments, the $MoS_2$ film formed in step b) may have a hexagonal crystalline structure.

In embodiments, the $MoS_2$ film formed in step b) may have a trigonal prismatic coordination geometry.

In embodiments, the film obtained after the annealing step b) may comprise residual $MoO_3$. This is typically the case for the temperatures and durations indicated in the embodiments of certain embodiments. This is advantageous because the inventors noticed that residual $MoO_3$ help in the delamination of the formed $MoS_2$ layer from its substrate upon contact with an aqueous medium (e.g. water).

In embodiments, the annealing may be performed for a time adequate so that residual $MoO_3$ is present in the layer.

In embodiments, the residual $MoO_3$ may represent from 1 to 12%, preferably from 1 to 6% of the annealed film. This can be calculated by Rutherford backscattering spectrometry (RBS).

In embodiments, the residual $MoO_3$ may be located at the interface between the substrate and the $MoS_2$ film.

The presence of the residual $MoO_3$ may be inferred for instance from x-ray photoemission electron spectroscopy (XPS) where a doublet centered at 229.5 eV indicative of $MoS_2$ is present together with a signal (e.g. a bump) at 236 eV indicative of residual $MoO_3$.

In a second aspect, a method is provided for providing a $MoS_2$ film on a second substrate other than the Si substrate of the first aspect, the method comprising i) forming an unsupported $MoS_2$ film in an aqueous medium by any method of the first aspect, and ii) dip coating the second substrate by immersing the second substrate in the aqueous medium, then withdrawing the second substrate from the aqueous medium, thereby coating the second substrate with the unsupported $MoS_2$ film.

This method of transfer is advantageous as it preserves the structural and chemical properties of the $MoS_2$ film during the transfer process.

In embodiments, the second substrate may be a dielectric substrate.

Transferring a $MoS_2$ film from a Si substrate to a dielectric substrate is advantageous because it reduces current leakage, thereby permitting the performance of electrical measurements. It is noteworthy that the activation of the sulfurization process requires an annealing which is typically not thermally compatible with many dielectric materials (e.g. polymer materials); hence, the method of certain embodiments permits the annealing step to be performed on a heat resistant substrate and the resulting $MoS_2$ film to be transferred to a more thermally fragile dielectric substrate.

In embodiments, the dielectric substrate may have a Tg or a melting temperature below 720° C.

In a third aspect, an assembly is provided comprising a) a Si substrate, b) a $MoO_3$ layer overlaying the substrate, and c) a $MoS_2$ film overlaying the $MoO_3$ layer.

Such an assembly is typically obtained as an intermediate after the annealing step b) of the method of the first aspect.

In a fourth aspect, an unsupported $MoS_2$ film obtainable by the method of the first aspect is provided.

In a fifth aspect, an assembly is provided of a $MoS_2$ film on a dielectric substrate obtainable by the method of the second aspect when the second substrate is a dielectric substrate.

In a sixth aspect, a semiconductor device is provided comprising an assembly according to the fifth aspect. Examples of such devices are optoelectronic devices, spintronic devices, field effect transistors (where the $MoS_2$ film can serve as a channel layer) and low power switches.

Particular and preferred aspects of the invention are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and advantages of certain embodiments will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

DESCRIPTION OF ILLUSTRATIVE EMBODIMENTS

Figures 1A, 1B:
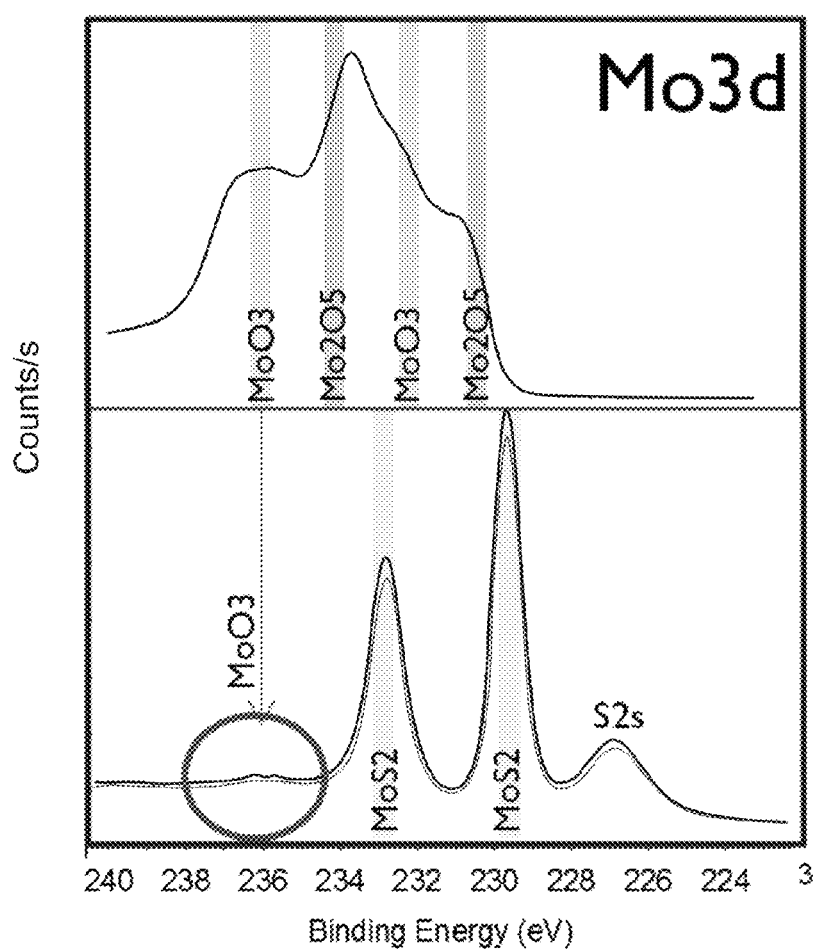
FIG. 1A is an XPS spectrum of the Mo oxide film formed in step a) of a method of one of the embodiments.
FIG. 1B is an XPS spectrum of the $MoS_2$ film formed in step b) of a method of one of the embodiments.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms "first", "second", "third" and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms "top", "bottom", "over", "under" and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of certain embodiments. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the invention.

In the description provided herein, numerous specific details are set forth. However, it is understood that embodiments of the invention may be practiced without these specific details. In other instances, well-known methods, structures and techniques have not been shown in detail in order not to obscure an understanding of this description.

The invention will now be described by a detailed description of several embodiments of the invention. It is clear that other embodiments of the invention can be configured according to the knowledge of persons skilled in the art without departing from the technical teaching of the invention, the invention being limited only by the terms of the appended claims.

Figure 3:
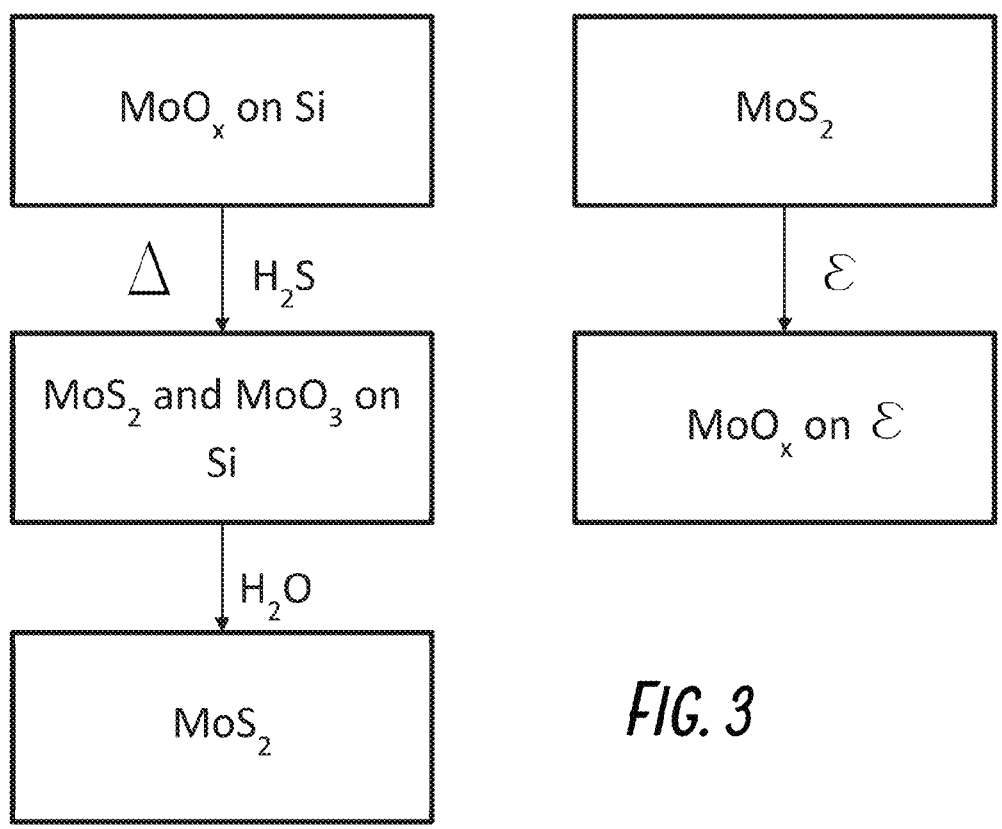
FIG. 3 is a block diagram illustrating a highly simplified form according to a method of one of the embodiments.

Examples 1, 2, and 3 are illustrated in FIG. 3 (left). Example 4 is illustrated in FIG. 3 (right).

EXAMPLE 1

Forming a Mo Oxide Layer on a Si Substrate

A Si substrate ($2 \times 2$ cm$^2$) was provided and exposed to a Mo reactive sputtering in $O_2$, thereby acquiring a 5 nm Mo oxide film on its top surface.

As shown in FIG. 1A, the film consists of different coexisting Mo oxide phases ($MoO_3$ and $Mo_2O_5$).

EXAMPLE 2

Forming a MoS$_2$ Film from the Mo Layer

The sample obtained at the end of Example 1 was loaded into a rapid thermal annealing (RTA) system—Annealsys oven AS-ONE150—for a sulfurization process. To this purpose the sample was annealed in pure $H_2S$ (100 mbar) at high temperature. Although annealing regime involving temperatures of 400° C. or higher typically permitted the obtaining of a MoS$_2$ film, the best results were obtained by a sulfurization process consisting of two annealing steps: 25 minutes at 600° C. followed by 5 minutes at 800° C. The first annealing step resulted in the formation of a uniform MoS$_2$ film, while the second step was useful for improving the crystalline quality of the material.

Figures 1C, 1D:
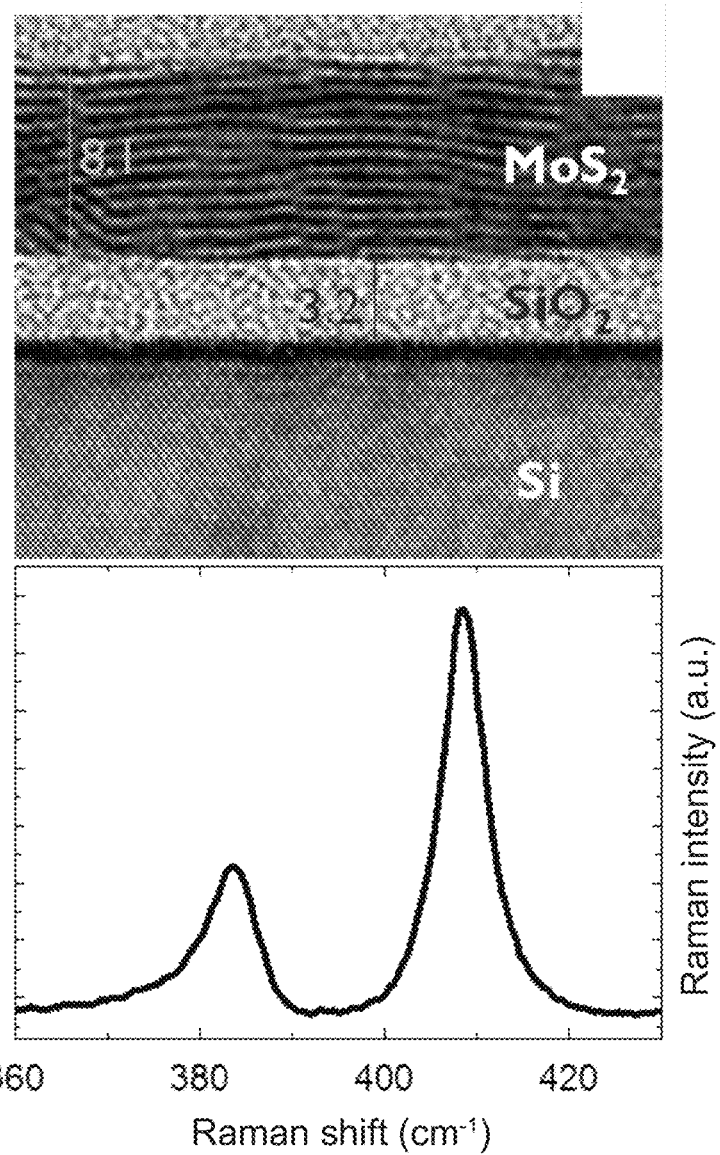
FIG. 1C is a tunneling electron microscopy (TEM) cross-section of a $MoS_2$ film obtained according to a method of one of the embodiments.
FIG. 1D is a Raman spectrum of a $MoS_2$ obtained according to a method of one of the embodiments.

The tunneling electron microscopy (TEM) cross-section shown in FIG. 1C evidences the characteristic layered structure of the MoS$_2$ film. One can observe that the general orientation of the MoS$_2$ sheets is parallel to the substrate. The thickness of the MoS$_2$ film was approximately 8 nm (12 molecular planes).

Raman spectroscopy has been used to study the crystalline structure of the synthetic MoS$_2$ film on Si. The Raman spectrum in FIG. 1D shows two distinctive peaks located at 383 cm$^{-1}$ and 408 cm$^{-1}$: these features corresponds respectively to the in-plane (E2g) mode and the out-of-plane (A1g) mode of MoS$_2$. This observation demonstrates that the sulfurization process resulted in the formation of a uniform MoS$_2$ film with hexagonal crystalline structure and trigonal prismatic coordination geometry.

Additional chemical insights were obtained by x-ray photoemission electron spectroscopy (XPS). The most prominent Mo3d doublet centered at ≈229.5 eV (FIG. 1B) can be associated with MoS$_2$. A small bump is visible at higher binding energy (236 eV). This additional XPS component is related to the presence of residual MoO$_3$. According to Rutherford backscattering spectrometry (RBS) measurements, the oxidized fraction of Mo is expected to be less than 6%.

Without being bound by theory, it is reasonable to assume that the sulfurization process starts from the upper Mo oxide/air interface since it is directly exposed to the H$_2$S gas. For this reason it is reasonable to expect the residual MoO$_3$ to be preferentially located at the interface between the MoS$_2$ film and the underlying Si substrate. MoO$_3$ being known to be slightly soluble in water, it is reasonable to assume that the delamination observed in water (see Example 3) between the MoS$_2$ film and the Si substrate is at least partly due to the presence of MoO$_3$ at their interface.

EXAMPLE 3

Separation of the MoS$_2$ Film from the Si Substrate

Figure 2:
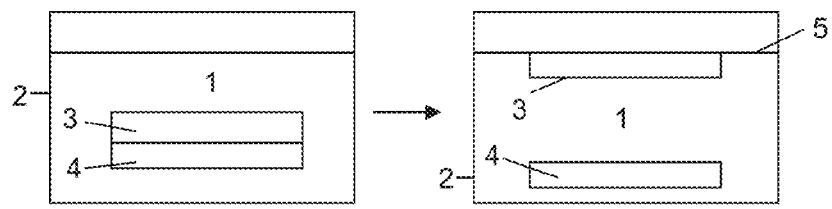
FIG. 2 is a schematic representation of step c) according to a method of one of the embodiments.

In order to transfer the MoS$_2$ film onto a dielectric substrate, the synthetic film has to be first detached from the underlying Si substrate while preserving the physical integrity, and the structural and chemical characteristics (uniform thickness, crystalline quality, stoichiometry) of the MoS$_2$ film. We now refer to FIG. 2. For this purpose, after the synthesis process described in example 2, the sample (3, 4) was put in a beaker (2) containing deionized water (1). Within a few seconds water penetrated in between the MoS$_2$ film (3) and the underlying substrates (4), starting from the edges. The intercalated water gradually propagated to the center of the sample (3, 4), thus inducing delamination of the MoS$_2$ film (3). Removing and replacing repeatedly the sample (3, 4) in the beaker helped speeding up delamination. The detached unsupported MoS$_2$ film (3) migrated to the liquid/air interface (5). The supernatant MoS$_2$ film (3) was then ready for the transfer process of example 4.

EXAMPLE 4

Transfer of the MoS$_2$ Film to a Dielectric Substrate (ϵ) by Dip-Coating

Dip-coating techniques are conventionally used to transfer graphene or MoS$_2$ films onto dielectric substrates (ϵ) or optical detection and electrical measurements. Dip coating techniques can be described as processes where the substrate (ϵ) to be coated is immersed in a liquid and then withdrawn at a constant speed.

Here, a fresh silicon plate overlaid by a SiO$_2$ layer was used as the substrate (ϵ). This substrate was used to fish out the supernatant MoS$_2$ film, followed by drying it on a hot-plate (90° C. for 5 min). An optical and scanning electron microscopy (SEM) image (not shown) indicated that the MoS$_2$ film after transfer onto the SiO$_2$/Si substrate (ϵ) is intact and uniform in thickness. Importantly the normalized Raman spectra before (MoS$_2$/Si) and after transfer (MoS$_2$/SiO$_2$) were almost identical (not shown). This observation demonstrates that the crystalline quality and chemical composition of the as-grown MoS$_2$ film were preserved during the transfer process.

Where a range of values is provided, it is understood that the upper and lower limit, and each intervening value between the upper and lower limit of the range is encompassed within the embodiments.

All references cited herein are incorporated herein by reference in their entirety. To the extent publications and patents or patent applications incorporated by reference contradict the disclosure contained in the specification, the specification is intended to supersede and/or take precedence over any such contradictory material.

Unless otherwise defined, all terms (including technical and scientific terms) are to be given their ordinary and customary meaning to a person of ordinary skill in the art, and are not to be limited to a special or customized meaning unless expressly so defined herein. It should be noted that the use of particular terminology when describing certain features or aspects of the disclosure should not be taken to imply that the terminology is being re-defined herein to be restricted to include any specific characteristics of the features or aspects of the disclosure with which that terminology is associated. Terms and phrases used in this application, and variations thereof, especially in the appended claims, unless otherwise expressly stated, should be construed as open ended as opposed to limiting. As examples of the foregoing, the term 'including' should be read to mean 'including, without limitation,' 'including but not limited to,' or the like; the term 'comprising' as used herein is synonymous with 'including,' 'containing,' or 'characterized by,' and is inclusive or open-ended and does not exclude additional, unrecited elements or method steps; the term 'having' should be interpreted as 'having at least;' the term 'includes' should be interpreted as 'includes but is not limited to;' the term 'example' is used to provide exemplary instances of the item in discussion, not an exhaustive or limiting list thereof; adjectives such as 'known', 'normal', 'standard', and terms of similar meaning should not be construed as limiting the item described to a given time period or to an item available as of a given time, but instead should be read to encompass known, normal, or standard technologies that may be available or known now or at any time in the future; and use of terms like 'preferably,' 'preferred,' 'desired,' or 'desirable,' and words of similar meaning should not be understood as implying that certain features are critical, essential, or even important to the structure or function of the invention, but instead as merely intended to highlight alternative or additional features that may or may not be utilized in a particular embodiment of the invention. Likewise, a group of items linked with the conjunction 'and' should not be read as requiring that each and every one of those items be present in the grouping, but rather should be read as 'and/or' unless expressly stated otherwise. Similarly, a group of items linked with the conjunction 'or' should not be read as requiring mutual exclusivity among that group, but rather should be read as 'and/or' unless expressly stated otherwise.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity. The indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage. Any reference signs in the claims should not be construed as limiting the scope.

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

All numbers expressing quantities of ingredients, reaction conditions, and so forth used in the specification are to be understood as being modified in all instances by the term 'about.' Accordingly, unless indicated to the contrary, the numerical parameters set forth herein are approximations that may vary depending upon the desired properties sought to be obtained. At the very least, and not as an attempt to limit the application of the doctrine of equivalents to the scope of any claims in any application claiming priority to the present application, each numerical parameter should be construed in light of the number of significant digits and ordinary rounding approaches.

It is to be understood that although preferred embodiments, specific constructions and configurations, as well as materials, have been discussed herein for devices according to the present invention, various changes or modifications in form and detail may be made without departing from the scope of this invention. Functionality may be added or deleted from the block diagrams and operations may be interchanged among functional blocks. Steps may be added or deleted to methods described within the scope of certain embodiments.

What is claimed is:

1. A method for forming an unsupported $MoS_2$ layer in an aqueous medium, comprising:
    providing an assembly of a Mo oxide layer on a Si substrate;
    annealing the assembly in a presence of $H_2S$ at a temperature sufficient to form an annealed $MoS_2$ layer; and
    contacting the annealed assembly with an aqueous medium, whereby an unsupported $MoS_2$ layer is obtained.

2. The method of claim 1, wherein the contacting comprises immersing the annealed assembly in the aqueous medium.

3. The method of claim 1, wherein an area of the unsupported $MoS_2$ layer is at least 1 $cm^2$.

4. The method of claim 1, wherein the annealing is performed in a presence of pure $H_2S$.

5. The method of claim 1, wherein the annealing is performed at a pressure of from 50 mbar to 200 mbar.

6. The method of claim 1, wherein the annealing comprises:
    annealing the assembly at a temperature of from 520° C. to 680° C. for from 5 minutes to 50 minutes; and thereafter
    annealing the assembly at a temperature of from 720° C. to 880° C. for from 1 minute to 10 minutes.

7. The method of claim 1, wherein the annealed $MoS_2$ layer comprises residual $MoO_3$.

8. The method of claim 7, wherein the residual $MoO_3$ represents from 1% to 12% of the annealed $MoS_2$ layer.

9. The method of claim 7, wherein the residual $MoO_3$ is in a layer located at an interface between the Si substrate and the annealed $MoS_2$ layer.

10. A method for providing a $MoS_2$ coating layer on a second substrate, the method comprising:
    forming an unsupported $MoS_2$ layer in an aqueous medium by the method of claim 1;
    dip coating a second substrate different from the Si substrate by immersing the second substrate in the aqueous medium; and thereafter
    withdrawing the second substrate from the aqueous medium, whereby the second substrate is coated with a $MoS_2$ coating layer.

11. The method of claim 10, wherein the second substrate is a dielectric substrate.

12. An assembly, comprising:
    a Si substrate;
    a $MoO_3$ layer overlaying the Si substrate; and
    a $MoS_2$ layer overlaying the $MoO_3$ layer.

13. The assembly of claim 12, wherein the assembly is a component of a semiconductor device.

* * * * *